United States Patent [19]
Bonitz et al.

[11] Patent Number: 5,592,416
[45] Date of Patent: Jan. 7, 1997

[54] ELECTRONIC STORAGE CIRCUIT

[75] Inventors: Rainer Bonitz, Bruckmühl; Peter Birkenseher, München, both of Germany

[73] Assignee: SGS-Thomson Microelectronics GmbH, Grasbrunn, Germany

[21] Appl. No.: 358,000

[22] Filed: Dec. 15, 1994

[30] Foreign Application Priority Data

Dec. 15, 1993 [DE] Germany .................. 43 42 821.5

[51] Int. Cl.$^6$ ................................. G11C 11/34
[52] U.S. Cl. ................ 365/185.01; 365/185.07; 365/185.32; 365/201
[58] Field of Search .................. 365/185, 900, 365/189.09, 201, 185.01, 185.18, 185.32, 185.07

[56] References Cited

U.S. PATENT DOCUMENTS

| | | | |
|---|---|---|---|
| 4,703,456 | 10/1987 | Arakawa | 365/185 |
| 5,339,272 | 8/1994 | Tedrow et al. | 365/189.09 |
| 5,399,928 | 3/1995 | Lin et al. | 365/189.09 X |
| 5,428,571 | 6/1995 | Atsumi et al. | 365/185 X |

OTHER PUBLICATIONS

Steve Forte, "Technology Focus Interview," *Electronic Engineering*, pp. 44–54, Sep. 1988.

"ASIC mit Digital-, Analog-und EEPROM-Zellen," *Design & Elektronik*, Ausgabe 13 vom 26.6, pp. 46–49, 1989.

*Primary Examiner*—David C. Nelms
*Assistant Examiner*—Huan Hoang
*Attorney, Agent, or Firm*—David V. Carlson; Harry K. Ahn; Seed and Berry LLP

[57] ABSTRACT

An electronic storage circuit for storing information, in particular switch control information for alternately switching circuit parts of integrated monolithic circuits, having two series connections inserted between the two poles of a voltage supply source each including an EPROM transistor and a MOS transistor, the control gates of the two EPROM transistors being connected jointly with a reference voltage source, and the gates of the two MOS transistors with the connection point of the EPROM transistor and the MOS transistor of the other series connection.

28 Claims, 4 Drawing Sheets

ELECTRONIC STORAGE CIRCUIT

TECHNICAL FIELD

The present invention relates to an electronic storage circuit.

BACKGROUND OF THE INVENTION

Integrated monolithic circuits are complicated structures, in particular if they have a high scale of integration, and necessitate great development effort and extensive preliminary work before they can go into volume production. High piece numbers are therefore desired for each integrated circuit. one occasionally requires several versions of a certain integrated circuit which often differ only slightly. For example it should be possible to choose between an RC oscillator and a quartz oscillator as a clock generator.

A conventional method for providing several similar versions of a certain type of integrated circuit is to provide all components for all versions of this certain type of integrated circuit on one and the same chip and to apply different conduction patterns for the various versions. However different masks are needed for producing the particular conduction pattern required.

This effort can be avoided by equipping one and the same integrated circuit with all circuit parts and conduction patterns necessary for its various versions and equipping this integrated circuit with switches for internally switching to the particular desired version with the aid of corresponding switch control signals. This also leads to the advantage that such an integrated circuit can be switched from the initially selected version to another version during the development phase or even during use.

For this purpose one can use a storage circuit of the type described in Design+Elektronik, no. 13, 27th June 1989, Markt & Technik, pages 46, 48 and 49, and in Electronic Engineering, September 1988, pages 44, 45, 48, 50 and 54. The switches of the integrated circuit can thereby be controlled in accordance with the storage state of the storage circuit.

As is well-known, erasable programmable read only memory (EPROM) transistors have a floating gate between the conduction channel and the control gate. The floating gate of the EPROM transistor contains no charges in the unprogrammed state, while it contains charges in the programmed state. Looking at an n-channel state. The EPROM transistor therefore becomes conductive when a voltage of about 1.9 V is applied to the control gate. With the programmed n-channel EPROM transistor negative charges are found on the floating gate, which means that such a transistor only conducts in the programmed state as of a control gate voltage of more than 5 V.

This different behavior between the programmed and unprogrammed EPROM transistor is utilized for information storage. This information can be used for example to control in the above-mentioned way the switching state of hardware switches located on the same semiconductor chip as the storage circuit.

With a storage circuit of the above-mentioned type no error can occur in terms of false storage information being delivered. After disturbances this storage circuit always independently resumes the correct circuit state in which it reliably delivers the programmed storage information. If there is a supply voltage drop, whether due to disturbances or to a deliberate shut-off, it suffices merely to turn the supply voltage back on to deliver the correct storage information again. No readout signal is required.

Such a storage circuit is not only suitable for providing switch control information for switches, but it can also be used advantageously wherever information is to be reliably stored and correctly outputted, over a very long time and without disturbances. This storage circuit is also excellently suited for nonvolatile memories for example.

It is generally necessary to perform repeated testing on the storage circuit and the circuit controlled by it. It may also become necessary to subsequently change the functions of the circuit controlled by the storage circuit, which means changing the storage fill of the storage circuit and thus reprogramming it. Testing and/or reprogramming might be necessary during operation of the controlled circuit without this operation being interrupted or impaired.

SUMMARY OF THE INVENTION

The invention is based on the problem of developing a type of storage circuit described above in such a way as to permit such testing and reprogramming in a simple and convenient way.

A solution to this problem is stated in claim 1. Advantageous developments are found in the subclaims.

With the inventive storage circuit it is possible merely by feeding accordingly selected logic signals to perform tests in a very flexible and manifold way, to simulate storage states differing from the particular programming state without having to perform a reprogramming, to check functions of the circuit configuration controlled by the storage circuit other than the circuit states given by the storage fill of the storage circuit, and even to perform repeated testing with a storage fill different from the one programmed when one time programmable storage elements are used.

If the storage circuit is constructed with storage elements which can be programmed repeatedly this can be done at any time with the aid of the programming means of the inventive storage circuit.

The programming transistors used are preferably voltage-stable transistors, i.e. transistors which withstand without damage at least the voltage levels occurring during a programming operation.

All circuit components of the storage means except the two EPROM transistors are shielded with the cutoff transistors during a programming operation. For this purpose the cutoff transistors are switched to the off-state during a programming operation, while they are otherwise conductive. Voltage-stable transistors are also preferably used for the cutoff transistors.

To permit circuit parts controlled by the storage fill of the storage circuit to be tested with respect to their reaction to different storage fills without having to reprogram the EPROM transistors for this purpose, a simulation transistor is connected in parallel with each EPROM transistor for simulating the driving into conduction of an actually nonconductive EPROM transistor.

A hold circuit is preferably connected to the output of the storage circuit for holding the particular storage value of the storage circuit. This has the advantage that a switch controlled with the output signal of the storage circuit is not impaired by programming or testing operations. Such programming or testing can be performed as desired, with or without storage by means of the hold circuit.

The reference voltage source of the inventive storage circuit permits a very manifold and flexible operation of the storage circuit despite a relatively simple circuit configuration.

As is generally known, the term "EPROM" is an abbreviation for "erasable programmable ROM," i.e. a programmable ROM whose programming can be erased again. Two different types are known. In a first type, usually called "EPROM," the programming is erased by exposure to UV light. In the other type the programming is erased electrically. The customary name for this type is "E$^2$PROM" (electrically erasable programmable ROM). The term EPROM as used herein is intended to include both types of erasable programmable ROM. Both types can be used in the same storage circuit. While the programming means is used only for programming and possibly for reading out the storage fill of the EPROMs with the EPROM erasable by UV light, the programming means is additionally used for erasure with the electrically erasable E$^2$PROM. For programming and erasure and possibly readout, different voltages are then merely given out accordingly by the programming means to the terminals of the E$^2$PROM transistors.

It is also conceivable to realize a part of the transistors of the total storage circuit by bipolar transistors. This holds for all transistors with the exception of the EPROM transistors themselves.

The invention and advantageous developments of the invention will now be explained in more detail with reference to embodiments.

DETAILED DESCRIPTION OF THE INVENTION

In the following description of various embodiments of the invention it is assumed that the EPROM transistors are EPROMs erasable by UV light.

In the Figures, p-channel transistors are marked by a small circle on the control gate. Transistors without such a circle are n-channel transistors.

Transistors marked in the Figures by two asterisks are formed as voltage-stable transistors so that they withstand without danger and damage the programming voltages which are relatively high compared to the supply voltage. This generally relates to n-channel transistors since p-channel transistors are fundamentally produced with higher electric strength.

Figure 1:
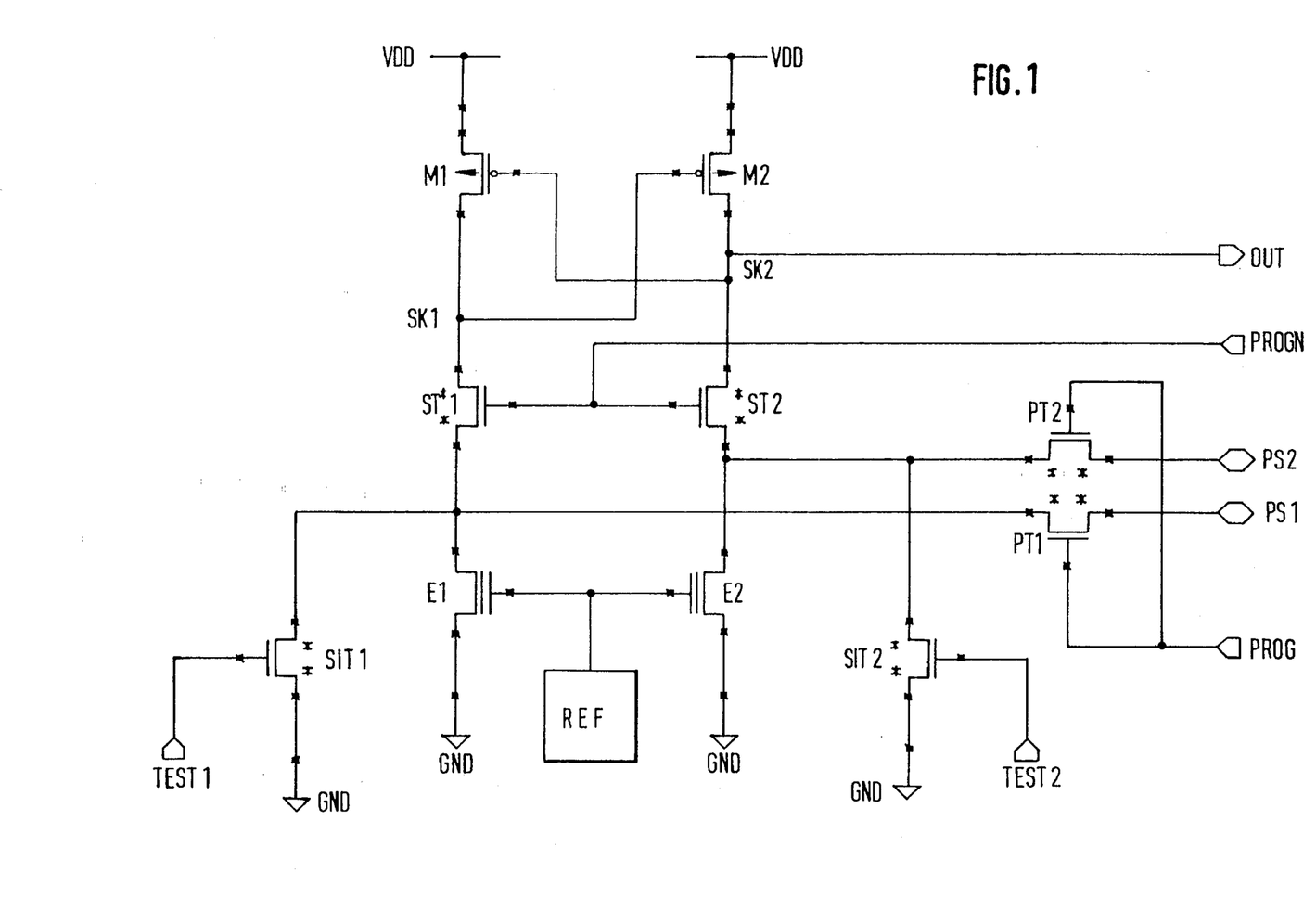
FIG. 1 shows a first embodiment of the inventive storage circuit.

FIG. 1 shows one embodiment of an inventive storage circuit according to principles of the present invention. Connected in parallel between supply voltage line VDD, which carries for example a supply voltage of 5 V, and a ground lead GND are a first series connection with first EPROM transistor E1, first cutoff transistor ST1 and first MOS transistor M1, and a second series connection with second EPROM transistor E2, second cutoff transistor ST2 and second MOS transistor M2. The control gates of EPROM transistors E1 and E2 are connected jointly to reference voltage source REF. First circuit node SK1 between ST1 and M1 is connected to the gate of M2. Second circuit node SK2 between ST2 and M2 is connected to the gate of M1. Second circuit node SK2 forms output OUT of the storage circuit.

An unprogrammed EPROM transistor contains no negative charges on its floating gate and therefore becomes conductive when a voltage of about 1.9 V is applied to its control gate. This voltage level can vary somewhat for EPROM transistors, which are produced using various processes. With the programmed EPROM transistor there are negative charges on the floating gate. This means that such a transistor is conductive only with a gate voltage of about 5 V. The transistors thought of here are n-channel EPROMS. But in an alternative embodiment, p-channel EPROM transistors can be used if the storage circuit is adapted accordingly.

Reference voltage source REF provides a reference voltage of about 3 V to the control gates of EPROM transistors E1 and E2 in the normal mode. The erased or unprogrammed EPROM transistor is therefore conductive while the programmed EPROM transistor is nonconductive. Assuming for example that E1 is unprogrammed and E2 programmed, E1 is conductive at this reference voltage while E2 is nonconductive. Since E1 is conductive, first circuit node SK1 is at low potential so that M2 is conductive. For this reason, and because E2 is nonconductive, second circuit node SK2 is at high potential. At output OUT of the storage circuit there is therefore logic value H, which can be attributed the binary value "1". Since this high output voltage is present at the gate of M1, the first MOS transistor M1 is nonconductive.

The initial state of OUT is stable and no transverse current flows through the storage circuit since a transistor is nonconductive in each series connection.

As one can see, no readout signal is required. It suffices to turn on the supply voltage, from which the reference voltage is derived. Even if there is a temporary outage of the supply voltage, whether due to a turn-off or due to disturbances, the correct storage information is available at output OUT again as soon as the supply voltage returns.

The programming means of the inventive storage circuit includes first programming transistor PT1 and second programming transistor PT2 via which the side of E1 or E2 not connected with GND is connected with first programming signal source PS1 or second programming signal source PS2. The gates of PT1 and PT2 are connected jointly to programming control signal source PROG. During a programming operation the control gates of EPROM transistors E1 and E2 receive a reference voltage of about 12.5 V. It will be explained below with reference to FIG. 3 how the reference voltage source does this.

During a programming operation programming transistors PT1 and PT2 are rendered conductive by a programming control signal (PROG) while a reference voltage of about 12.5 V is simultaneously given out to the control gates of E1 and E2. One of the two EPROM transistors E1 and E2 to be programmed receives a programming voltage of about 7 V from corresponding programming signal source PS1 or PS2 via corresponding programming transistor PT1 or PT2. From the resulting current through the EPROM transistor to be programmed, charge carriers are sucked into the floating gate by a tunnel effect due to the high reference voltage of about 12.5 V, and remain there after the programming operation. In an alternative embodiment, instead of two programming signal sources PSI and PS2 one can use one joint programming signal source and obtain the selection of the particular EPROM transistor E1, E2 to be programmed solely by driving PT1 and PT2 selectively.

Cutoff transistors ST1 and ST2 are formed as voltage-stable transistors and are to shield the circuit parts located above cutoff transistors ST1 and ST2 from the programming operation and its high voltages. For this purpose the gates of ST1 and ST2 are connected jointly with control signal source PROGN that provides these gates with an inverted version of the programming control signal from programming control signal source PROG. This renders cutoff transistors ST1 and ST2 nonconductive during a programming operation, while they are conductive outside such programming operations.

The inventive storage circuit additionally has simulation transistors SIT1 and SIT2 connected in parallel with first EPROM transistor E1 and second EPROM transistor E2, respectively. The gates of SIT1 and SIT2 are connected with test signal source TEST1 and TEST2, respectively. Both transistors are formed as voltage-stable transistors.

Simulation transistors SIT1 and SIT2 are provided to permit the circuit parts driven by the output signal of the storage circuit to be tested with respect to their behavior at different storage fills of the storage circuit without having to reprogram EPROM transistors E1 and E2 or when one time programmable PROM elements are provided instead of EPROM transistors. The simulation takes place by a programmed EPROM transistor or PROM element that is nonconductive at the normally applied lower reference voltage level of about 3 V being bridged by a conductive simulation transistor.

To realize both signal states of output OUT of the storage circuit it would normally be necessary to produce a combination of E1 programmed/E2 unprogrammed for a first test phase and a combination of E1 unprogrammed/E2 programmed in another test phase. In the prior art storage circuits, this would necessitate a time-consuming intermediate erasure of EPROM transistors E1, E2 by UV irradiation. This requirement can be avoided by using simulation transistors SIT1, SIT2. After the first combination of E1 programmed/E2 unprogrammed has been realized and tested for example, E2 is also programmed. The second possibility, E1 unprogrammed/E2 programmed, can then be simulated by bridging E1 by SIT1. That is, both EPROM transistors E1 and E2 are then programmed and all programming combinations of E1 and E2 can be simulated with simulation transistors SIT1 and SIT2. In an alternative embodiment, instead of or in addition to simulation transistors SIT1 and SIT2 connected in parallel with E1 and E2, one can use simulation transistors that are connected in series with E1 and E2 and rendered nonconductive or conductive depending on the combination to be simulated. For this purpose one could also use cutoff transistors ST1 and ST2 already present, if they can be driven separately by two different test signal sources. By this simulation one can put a switch controlled by the signal at output OUT of the storage circuit alternately in each switching state, without reprogramming, in order to see how the circuit configuration succeeding the switch reacts. For safety reasons it should preferably be possible to switch simulation transistors SIT1, SIT2 to a simulating state only in the test mode.

The storage circuit can also be constructed with one time programmable storage cells (PROM). The test procedure here will be described in the following in connection with the various modes of reference voltage source REF.

Figure 2:
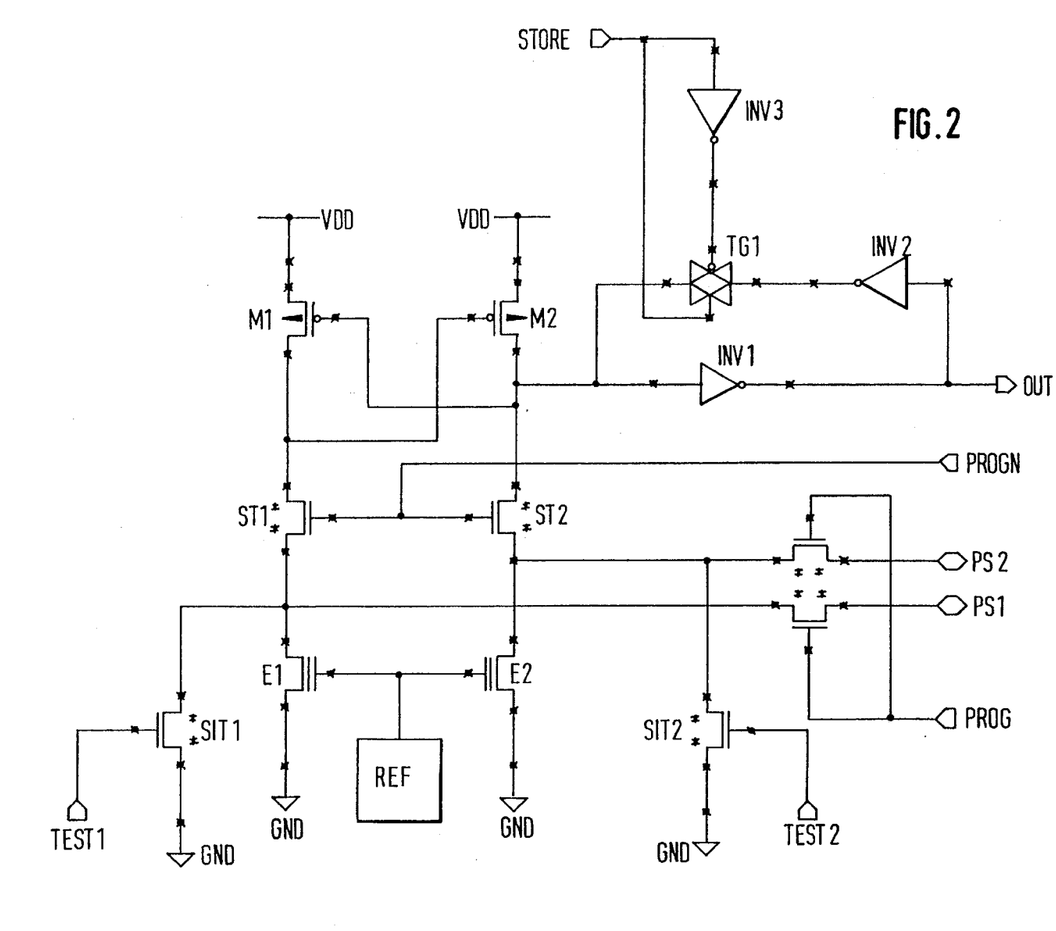
FIG. 2 shows a second embodiment of an inventive storage circuit having a holding means in addition to the embodiment shown in FIG. 1.

FIG. 2 shows an embodiment of the inventive storage circuit that has a hold circuit or a LATCH in addition to the embodiment shown in FIG. 1. In the known way this circuit has between SK2 and OUT first inverter INV1 that is bridged by a series connection comprising second inverter INV2 and so-called transmission gate TG1. TG1 is formed by the parallel connection of a p-channel transistor and an n-channel transistor. This parallel connection is used because a "1" is gated properly only by a p-channel transistor and a "0" only by an n-channel transistor.

Storage control signal STORE is fed to the gates of the two transistors of transmission gate TG1 directly or via third inverter INV3. This signal activates the hold circuit only when cutoff transistors ST1 and ST2 are put in the off-state for carrying out a programming operation. Before the beginning of such a programming operation and thus before ST1 and ST2 are rendered nonconductive, the current storage information present at second circuit node SK2 is stored. The switch connected to output OUT cannot jump and thus cause disturbances during the programming operation.

The embodiment of an inventive storage circuit shown in FIG. 2 combines:

latching capability programmability and readability of EPROM transistors testability interference immunity in normal mode but also during testing and programming.

Readability is given since the programming states of EPROM transistors E1 and E2 can be read out via the lines connected with programming signal sources PS1 and PS2.

FIGS. 1 and 2 show a reference voltage source of reference voltage circuit REF as a circuit block that feeds reference voltage VREF jointly to the control gates of EPROM transistors E1 and E2. Reference voltage source REF will now be explained with reference to FIG. 3.

Figure 3:
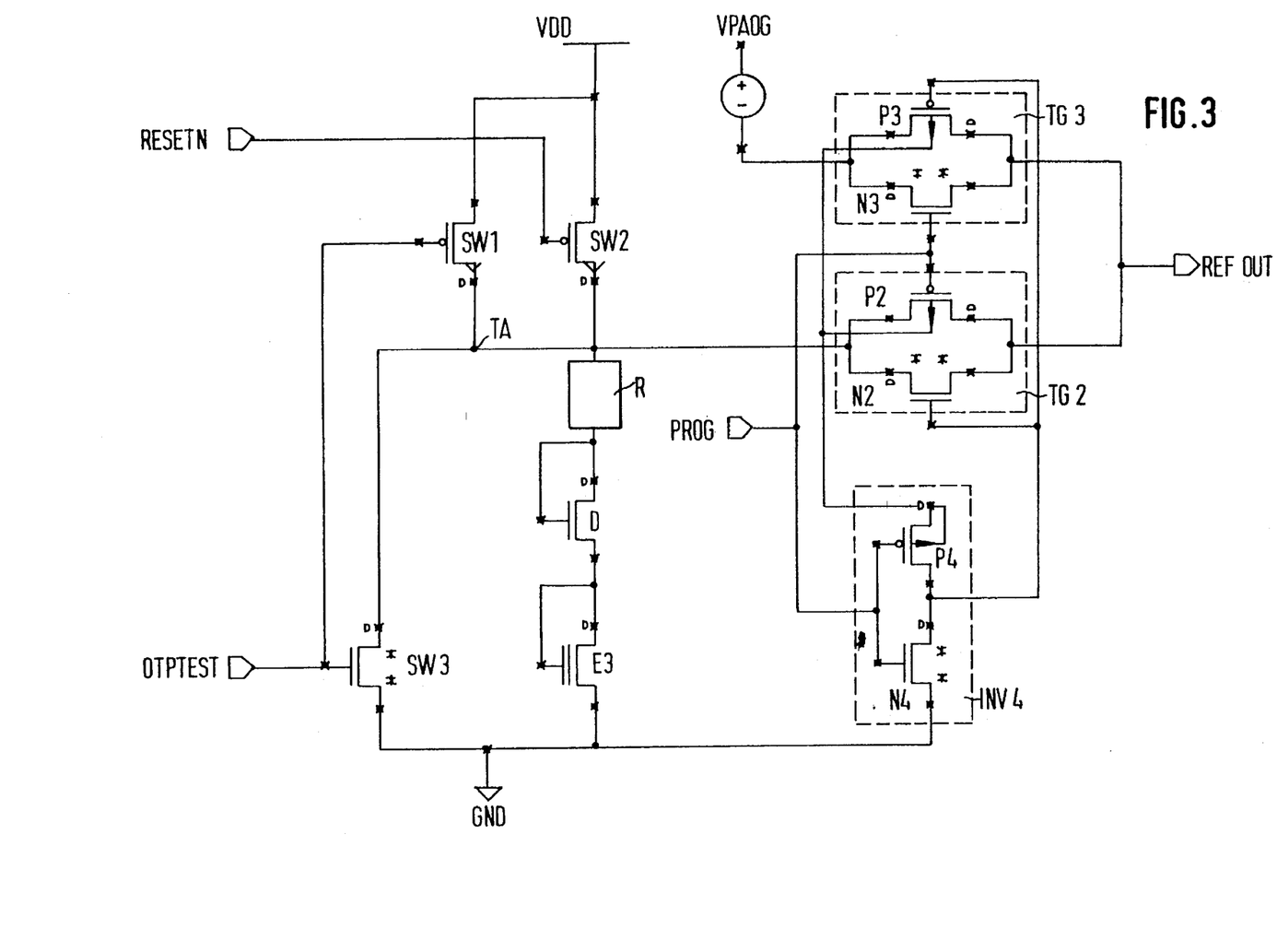
FIG. 3 shows an embodiment of a reference voltage source of the inventive storage circuit.

The reference voltage source shown in FIG. 3 has a voltage divider having a series connection with first switching transistor SW1, diffused low-impedance resistor R, transistor D wired as a diode, and third EPROM transistor E3 likewise wired as a diode. This series connection is connected between poles VDD and GND of a supply voltage source. Between SW1 and R there is partial voltage tap point TA of the voltage divider. First switching transistor SW1 is produced in such a way that it is also of high impedance in the on-state. It preferably has a resistance in the range of about 10 MΩ to about 20 MΩ in the on-state. This means that a very small current of at most a few 100 nA always flows through the voltage divider even when SW1 is conductive. This protects the supply voltage source, which is important particularly when it is formed by a battery.

Connected in parallel with first switching transistor SW1 is second switching transistor SW2, which has low impedance in the on-state.

Connected in parallel with the part of the voltage divider located between TA and GND is third switching transistor SW3.

The gate electrodes of SW1 and SW3 are connected jointly with logic signal source OTPTEST. The gate connection of SW2 is connected with logic signal source RESETN.

Connected between partial voltage tap point TA and output connection REFOUT of the reference voltage source is second transmission gate TG2 which in the on-state gates the voltage present at partial voltage tap point TA to output REFOUT.

Connected between programming voltage source VPROG and the output is third transmission gate TG3 which in the on-state gates programming voltage VPROG to output REFOUT of reference voltage circuit REF. For the reasons already explained in connection with TG1 in FIG. 2, transmission gates TG2 and TG3 have both a p-channel transistor and an n-channel transistor in parallel connection so that they readily gate both the voltage level of a logic signal "0" and the voltage level of a logic signal "1".

TG2 contains the parallel connection of n-channel transistor N2 and p-channel transistor P2. TG3 contains the parallel connection of n-channel transistor N3 and p-channel transistor P3.

The control gates of P2 and N3 are connected directly with logic signal source PROG, while the control gates of N2 and P3 are connected with logic signal source PROG via fourth inverter INV4. INV4 contains p-channel transistor P4 and n-channel transistor N4 in series connection.

In the embodiment shown the supply voltage source provides supply voltage VDD=5 V. Programming voltage VPROG is 12.5 V during a programming operation and otherwise 5 V like the supply voltage. The voltage level of logic signal PROG is likewise 12.5 V when the latter has logic value "1" or "H". The customary logic signal values suffice for logic signals RESETN and OTPTEST.

Reference voltage source REF is firstly intended to cause readout of the electronic storage cell in FIG. 1 or 2 during operation. However it is furthermore intended to permit programming of the storage cell and support testability.

In the following the mode of functioning of reference voltage source REF will be explained for various operating states.

1. Normal mode

In normal mode the input signals of reference voltage circuit REF are at the following logic levels:

OTPTEST=0
RESETN=1
PROG=0

Also, VPROG=VDD.

Due to these input values, transistors SW2, SW3, N3, P3 and N4 are nonconductive. Transistors SW1, N2, P2 and P4 are conductive.

Since transistors D and E3 are each wired as a diode by their control gates being connected with their drain terminals, D and E3 are in so-called weak inversion and the voltage drop at each of these two transistors is approximately its inception voltage $V_{TH}$ at which the particular transistor becomes conductive. In the case of transistor D the inception voltage is about +0.9 V. Third EPROM transistor E3 is in the erased (unprogrammed) state and therefore has an inception voltage of about +1.9 V. As long as supply voltage VDD is sufficiently high, D and E3 each forms a component with a constant voltage drop, the sum of these voltage drops being about 2.8 V. Since diffused resistor R has low impedance, partial voltage tap point TA is at about 3 V at a normal voltage level of VDD.

The transverse current necessary for producing the partial voltage flows through SW1. Since this current flows continuously in the normal mode of the reference voltage source it is held at the above-mentioned low value of a few hundred nA with the aid of transistor SW1 which has high impedance in the on-state.

Since transmission gate TG2 is conductive in the normal mode of the reference voltage source, the voltage level of about 3 V occurring at partial voltage tap point TA appears at output REF OUT of the reference voltage source.

Instead of transistor D one could also use another component with a fixed voltage drop, for example a diode.

The purpose of the described reference voltage source will now be explained.

A readout of the "static EPROM cell" of the inventive storage circuit with an excessive voltage (e.g. VDD) is disadvantageous for the following reasons.

a) When output voltage VREF of reference voltage source REF exceeds the inception voltage of the programmed EPROM transistor a transverse current begins to flow in the static EPROM cell. This is because the MOS transistor connected in series with the programmed EPROM transistor is conductive. The result is an increase in the power consumption of the integrated circuit. This is undesirable in particular when power is supplied from a battery. It should be mentioned that the inception voltage of programmed EPROM transistors decreases constantly due to natural aging. This is because charges are constantly lost from those stored on the floating gate of the programmed EPROM transistor.

b) If a transverse current flows through a programmed EPROM transistor and the MOS transistor connected in series therewith, the so-called "soft programming" effect can occur. That is, the erased EPROM transistor is programmed unintentionally in the course of time because charges reach the floating gate due to the transverse current. This creates the danger of the static EPROM cell losing the stored information in the course of time or the stored information changing.

Both effects mean a considerable disadvantage and can lead in practice to a system failure of the circuit controlled by the storage fill of the storage cell.

Reference voltage source REF of the inventive storage circuit has the advantage that reference voltage VREF is always only about 900 mV above the inception voltage of the erased EPROM transistor. This is because reference voltage VREF of the reference voltage source is determined, as mentioned above, by the sum of the inception voltage of third EPROM transistor E3 wired as a diode, which is about 1.9 V, and the inception voltage of transistor D wired as a diode, which is about 0.9 V. Since EPROM transistor E3 of reference voltage source REF belongs to the same integrated monolithic circuit as EPROM transistors E1 and E2 of the EPROM cell, E3 behaves just like E1 and E2. This makes the total storage circuit including the reference voltage source technology-dependent, which offers high reliability. If the inception voltage of EPROM transistors E1 and E2 of the EPROM cell shifts due to process variations of the method for producing the integrated circuit, EPROM transistor E3 in the reference voltage source participates in this shift. That is, if the inception voltage of E1 and E2 changes due to process variations the inception voltage of E3 changes accordingly and reference voltage VREF of reference voltage source REF is corrected accordingly.

Even if supply voltage VDD drops, the voltage drops across D and E3 remain constant at about 0.9 V or about 1.9 V. That is, the voltage drop across conductive switching transistor SW1 decreases. If supply voltage VDD no longer suffices to permit these constant voltage drops across D and E3, D and E3 pass into the off-state. At partial voltage tap point TA and thus at the output of reference voltage source REF, decreased supply voltage VDD then arises as the potential. This permits the static EPROM cell of the inventive storage circuit to be read out until VDD drops to the inception voltage dependent on the manufacturing technology ($V_{thEPROM}$~1.9 V).

2. Reset mode

In the reset mode logic signal values and voltage levels are present as in the above-described normal mode except for the logic signal RESETN, which is now at logic value "0". This renders second switching transistor SW2 conductive. SW2 is a low-impedance conductive transistor. In the reset mode the low-impedance conductive path of SW2 is thus connected in parallel with the high-impedance path of conductive SW1. This causes a greater current to be sent into the storage circuit via output REFOUT of reference voltage source REF than when only first switching transistor SW1 is conductive. The gate electrodes connected to REFOUT constitute a certain capacity. Since switching on SW2 causes a higher current to be supplied by REFOUT these capacities are charged faster. In the reset mode, i.e. when the circuit configuration is switched on, there is therefore a faster stabilization of the total circuit than if only high-impedance conductive switching transistor SW1 were switched on.

Due to low-impedance conductive switching transistor SW2, reference voltage VREF is a few hundred mV higher than in the normal mode, which is also advantageous for the dynamics of the automatic readout of the static EPROM cell when the circuit configuration is switched on in the reset mode.

3. Programming mode

For the programming mode, reference voltage source REF is operated in such a way as to provide reference voltage VREF that is suitable for programming the particular one of EPROM transistors E1 and E2 of the storage circuit. In this mode the following logic signals are present:

OTPTEST=0
RESETN=1
PROG=1.

The programming voltage source has programming voltage VPROG 12.5 V. The supply voltage VDD remains at 5 V.

PROG=1 means that transistors P3 and N3 are conductive while transistors P2 and N2 are nonconductive. That is, transmission gate TG3 is conductive while transmission gate TG2 is nonconductive. The programming voltage of about 12.5 V therefore reaches output REFOUT of reference voltage source REF. The static EPROM cell can thus be programmed via inputs PS1 and PS2.

As shown in FIG. 3, inverter IN4 comprising transistors P4 and N4 in reference voltage source REF is connected not to VDD but to VPROG. Also, the n-conducting well of the integrated circuit in which transistors P2, P3 and P4 are located is connected to the potential of VPROG. If one did not do this short-circuits would arise in the programming mode in the form of conductive diodes in the n-well. Also, the logic signal PROG should be at the potential of VPROG of about 12.5 V at logic value "1." Otherwise inverter IN4 would draw transverse current and TG2 would not be nonconductive.

4. Test mode

Depending on what kind of storage elements are used for the storage circuit, reference voltage source REF is operated differently.

a) Storage circuit with EPROM transistors

In this case reference voltage source REF is operated as in normal mode. Both PROM transistors E1 and E2 of the storage circuit are first programmed so that they are both nonconductive in normal read mode. Simulation transistors SIT1 and SIT2 are then driven into the on- or off-state depending on the desired test conditions.

b) One time programmable storage elements

One time programmable (OTP) storage elements have the same semiconductor configuration as EPROM transistors. However OTP transistors are packed in a housing without the windows that EPROM transistors need for their exposure to UV light for purposes of erasure. With OTP transistors only one programming operation is possible after packing since they can no longer be erased by UV light.

Each storage element is usually tested twice, once before packing and once after packing. After packing no programming for test purposes is permitted any longer with OTP elements, however, because no further programming is possible. A test mode as described above in a) is therefore not possible.

To permit the static storage cell to be tested nevertheless, logic signal OTPTEST is now set to logic value "1" in reference voltage source REF. All other logic signals and voltage levels are selected as in normal mode. Logic value "1" of logic signal OTPTEST leads to SW1 becoming nonconductive and SW3 conductive. This causes partial voltage tap point TA and thus also output REFOUT of reference voltage source REF to be connected to ground. That in turn means that not only the programmed but also the unprogrammed storage transistors in the static storage cell are nonconductive and thus behave like programmed transistors. One can now test again with the aid of simulation transistors SIT1 and SIT2.

5. Mode for a ROM storage circuit

By modifying the mask sequence and introducing a special implant mask during production of the storage transistors it is possible to program the static storage cell definitely during production. EPROM transistors E1 and E2 are converted into normal n-channel transistors, the transistor to be programmed being interrupted on its drain side. This is done by interrupting the diffusion.

One can therefore also permit high reference voltage VREF or VDD as the reference voltage. There is no danger of transverse current since the programmed transistor can never become conductive.

It makes sense to set reference voltage VREF at VDD and to turn off reference voltage source REF altogether to prevent even the small transverse current which the reference voltage source draws in normal mode due to the conduction of high-impedance conductive switching transistor SW1.

If a reference voltage is produced for an EPROM storage circuit, low-impedance diffusion resistor R is effective. If the storage transistors are designed as ROM transistors the diffusion of diffusion resistor R is interrupted by the special implant mask so that conductive path SW1 (and possibly SW2), D and E3 is nonconductive and output REFOUT of reference voltage source REF is connected with VDD via SW1 (and possibly via SW2 in addition).

Generally, it will not be necessary to switch logic signal OTPTEST from logic value "0" to logic value "1" since the initial state defined by a mask set is usually tested in the static ROM cell.

Instead of interrupting the diffusion of diffusion resistor R it is also possible to interrupt the diffusion on the drain side of EPROM transistor E3, in the same way as happens during programming of the static ROM cell of the storage circuit.

The above considerations show that the described reference voltage source REF permits great reliability and flexibility of the storage circuit:

reference voltage independent of manufacturing technology;

OTP elements testable in package; protection from faulty readout of storage value due to aging and thus protection from system failure due to aging; quick turn-on response;

possibility of programming; and transition to static ROM storage cell possible with same circuit.

In an embodiment of the inventive storage circuit that is equipped with E²PROM transistors one could perform programming, erasure and readout of the E²PROM transistors via the lines connected to programming signal sources PS1 and PS2 and via the switchover of the switchable reference voltage source. One need only change the voltage levels to apply the suitable voltage levels for each of these three operations to the corresponding electrodes of the E²PROM transistors.

Figure 4:
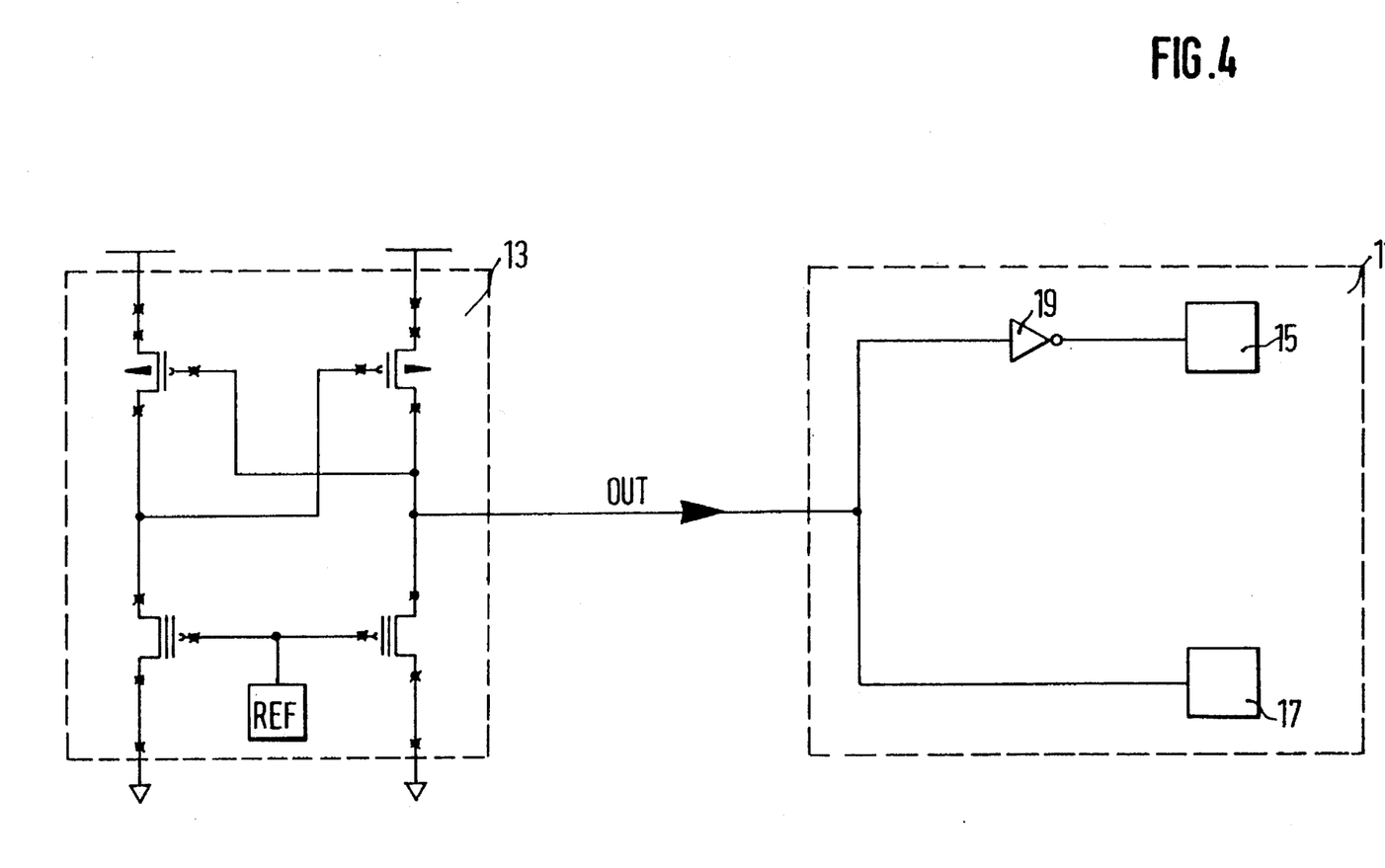
FIG. 4 shows a circuit configuration in which an inventive storage circuit is used for controlling a circuit configuration.

FIG. 4 shows a schematized basic circuit diagram of circuit configuration 11 that can be switched between two operating states with the aid of the output signal of inventive storage circuit 13. Storage circuit 13 is shown in a very simplified basic form. The various operating states are realized in this example by first circuit part 15 or second circuit part 17. Assuming that each of circuit parts 15 and 17 can be activated by control signal "1" and switched off by control signal "0," circuit part would be active with output signal "1" at output OUT of storage circuit 13, and circuit part 15 switched off due to preceding inverter 19.

The advantages of the inventive storage circuit can be summarized once again as follows:

interference immunity in comparison to dynamic circuit concepts;

static solution, i.e. no control signals necessary; programmability;

testability;

effort minimized: to define various hardware states of an integrated circuit one no longer needs different masks or fusing of metal bridges;

by exchanging some masks one can make EPROM-programmable cells into a fixed-programmed ROM cell. In this way one can put pilot series constructed with EPROM-programmable cells in high-volume production with fixed-programmed ROM cells.

We claim:

1. An electronic storage circuit for storing information comprising:

a first programmable transistor for storing information therein;

a first MOS transistor connected in series with the first programmable transistor, a common node therebetween defining a first circuit node;

a second programmable transistor for storing information therein;

a second MOS transistor connected in series with the second programmable transistor, a common node therebetween defining a second circuit node;

the gate of the first MOS transistor being coupled to the second circuit node, and the gate of the second MOS transistor being coupled to the first circuit node;

a programming circuit for programming the programmable transistors;

a cutoff circuit for electrically isolating the circuit nodes from the programmable transistors during programming of the programmable transistors;

a simulation switch connected to at least one of the two programmable transistors, the simulation switch for changing at the corresponding circuit node a voltage level representing the stored information in the respective programmable transistor without changing the stored information therein; and a reference voltage circuit connected to gates of the programmable transistors, the reference voltage circuit being capable of generating a voltage level for reading stored information in the programmable transistors and a voltage level for programming information in the programmable transistors.

2. An electronic storage circuit for storing information having a parallel connection inserted between two poles of a supply voltage source and comprising a first series connection with a first EPROM transistor, a first MOS transistor and a first circuit node therebetween, and a second series connection with a second EPROM transistor, a second MOS transistor and a second circuit node, the gate of each of the two MOS transistors being connected with the circuit node of the other series connection, and the circuit node of one of the two series connections providing an output signal of the storage circuit, wherein the two EPROM transistors are connected with a programming means capable of selecting only the first or the second EPROM transistor to be placed in a programmed state and to leave the other EPROM transistor in an unprogrammed state depending on the information to be stored; the programming means includes:

a first and a second programming transistor respectively connecting the first and second EPROM transistors to a programming signal means that applies a programming signal only to the selected one of the two EPROM transistors and no programming signal to the other during a programming operation, and a programming control signal means that renders the two programming transistors conductive during a programming operation;

a cutoff transistor is inserted in each of the two series connections between the circuit nodes and a connection point between EPROM transistor and programming transistor, said cutoff transistor being switchable by means of the programming control signal means to an off-state and otherwise to an on-state during a programming operation;

at least one simulation transistor is connected in parallel or in series with each of the two EPROM transistors, each simulation transistor being switchable alternately to an on- or off-state by means of a corresponding test signal for test simulation purposes;

the control gates of the two EPROM transistors are connected jointly with a reference voltage source that includes:

a voltage divider inserted between the two poles of the supply voltage source and having a first switching transistor inserted between one of the two poles and a partial voltage tap point, and a series connection inserted between the partial voltage tap point and the other of the two poles and comprising a first circuit element with a constant voltage drop and a second circuit element with a constant voltage drop in the form of a third EPROM transistor wired as a diode, the voltage divider being dimensioned in such a way that a voltage present at the partial voltage tap point suffices to switch the unprogrammed EPROM transistor to the on-state but not the programmed EPROM transistor, a first controllable switch inserted between the partial voltage tap point and the output of the reference voltage source for gating, in the on-state, the partial voltage level present at the partial voltage tap point to the output, a programming reference voltage source with a programming reference voltage high enough for programming an EPROM transistor, and a second controllable switch inserted between the programming reference voltage source and the output of the reference voltage source for gating, in the on-state, the programming reference voltage to the output, the controllable switches and being controlled by the programming control signal means in such a way that only the second controllable switch and otherwise only the first controllable switch is rendered conductive during a programming operation, and the three EPROM transistors being part of one and the same integrated monolithic circuit and produced by the same method steps.

3. The storage circuit of claim 2 wherein the first switching transistor is formed as a high-impedance conductive transistor.

4. The storage circuit of claim 3 wherein the first switching transistor has a resistance in the range of about 10 MΩ to about 20 MΩ in the on-state.

5. The storage circuit of claim 3 wherein a low-impedance conductive second switching transistor is connected in parallel with the first switching transistor, being rendered conductive when the storage circuit is turned on for a predetermined turn-on time period.

6. The storage circuit of claim 2 wherein a third switching transistor is inserted between the partial voltage tap point and a connection to ground of the supply voltage source, being drivable into the on- or off-state contrary to the first switching transistor.

7. The storage circuit of claim 2 wherein a conductive bridge that can be selectively placed in an off-state is inserted in the series connection between the partial voltage tap point and the other pole of the supply voltage source.

8. The storage circuit of claim 2 wherein the stored information can be picked up from the circuit node of one of the two series connections, and a hold circuit is connected with this circuit node for storing the particular information occurring at this circuit node at least for the time period during which the cutoff transistors are driven into the off-state.

9. The storage circuit of claim 2 wherein a one time programmable PROM element is provided instead of the first and second EPROM transistors in each case.

10. The storage circuit of claim 2 wherein a fixed-programmed ROM element is provided instead of the first and second EPROM transistors in each case.

11. The storage circuit of claim 2, further comprising a circuit configuration having a plurality of selectable functions which are selected by means of at least one controllable switch, wherein the switch receives its switch control information determining the selection from the output signal of the storage circuit.

12. The circuit configuration of claim 11, characterized in that it is monolithically integrated.

13. An electronic storage circuit for storing information comprising:

a first programmable transistor for storing information therein;

a first MOS transistor connected in series with the first programmable transistor, a common node therebetween defining a first circuit node;

a second programmable transistor for storing information therein;

a second MOS transistor connected in series with the second programmable transistor, a common node therebetween defining a second circuit node;
the gate of the first MOS transistor being coupled to the second circuit node, and the gate of the second MOS transistor being coupled to the first circuit node;

a programming means for programming the programmable transistors;

a cutoff means for electrically isolating the circuit nodes from the programmable transistors during programming of the programmable transistors;

at least one simulation switch connected to at least one of the two programmable transistors, the simulation switch for changing at the corresponding circuit node a voltage level representing the stored information in the respective programmable transistor without changing the stored information therein; and a reference voltage circuit connected to gates of the programmable transistors, the reference voltage circuit being capable of generating a voltage level for reading stored information in the programmable transistors and a voltage level for programming information in the programmable transistors.

14. The device according to claim 13 wherein each simulation transistor is connected in parallel or in series with the respective programmable transistor.

15. The device according to claim 13 wherein the programmable transistors are EPROM transistors.

16. The device according to claim 13 wherein the programmable transistors are one time programmable PROM transistors.

17. The device according to claim 13 wherein the programmable transistors are ROM elements.

18. The device according to claim 13 wherein the reference voltage circuit comprises:

a first circuit element configured as a diode having a constant voltage drop;

a second circuit element configured as a diode having a constant voltage drop connected in series with the first circuit element;

a first switching transistor connected in series with the first circuit element, the connection point therebetween defining a voltage tap point that provides a voltage level for reading stored information in the programmable transistors;

a programming reference voltage source for providing a voltage level for programming information in the programmable transistors;

a switch controlled by the programming means, and coupled to the voltage tap point and the programming reference voltage source, the switch for selectively outputting to the gates of the programmable transistors the voltage level present at the voltage tap point during non-programming of the programmable transistors or the voltage level produced by the programming reference voltage source during programming of the programmable transistors.

19. The device according to claim 18 wherein the second circuit element is an EPROM transistor configured as a diode.

20. The device according to claim 18 wherein the second circuit element and the programmable transistors are formed in an integrated circuit device and are produced using the same processing steps.

21. The device according to claim 18 wherein the first switching transistor is a high-impedance conductive transistor.

22. The device according to claim 21 wherein the resistance of the first switching transistor in a conductive state is in a range of about 10 MΩ to about 20 MΩ.

23. The device according to claim 18, further comprising a low-impedance second switching transistor connected in parallel with the first switching transistor, the second switching transistor being turned on for a pre-determined period when the storage circuit is turned on.

24. The device according to claim 18, further comprising a third switching transistor corrected between the voltage tap point and ground whereby the third switching transistor has an opposite conduction state to the conduction state of the third switching transistor to selectively provide a conduction path from the voltage tap point to ground.

25. The device according to claim 18, further comprising a diffusion resistor connected in series between the voltage tap point and the first circuit element, wherein the diffusion resistor can be selectively placed in a non-conductive state during formation thereof.

26. The device according to claim 13 wherein the first or the second circuit node provides an output signal of the storage circuit and further comprising a hold circuit connected to the output signal of the storage circuit for holding the output signal when the circuit nodes are isolated from the programming transistors during programming thereof.

27. The device according to claim 13 wherein the first or the second circuit node provides an output signal of the storage circuit and further comprising a circuit configuration having a plurality of selectable functions; and a selection switch for selecting a function among the selectable functions, the selection switch being controlled by the output signal of the storage circuit.

28. The device according to claim 27 wherein the circuit configuration is monolithically integrated with the storage device.

* * * * *